(12) United States Patent
Harrison

(10) Patent No.: US 9,105,385 B2
(45) Date of Patent: Aug. 11, 2015

(54) SUPERCONDUCTIVE ELECTROMAGNET APPARATUS

(71) Applicant: SAMSUNG ELECTRONICS CO., LTD., Suwon-si (KR)

(72) Inventor: Stephen M Harrison, Wallingford (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 181 days.

(21) Appl. No.: 13/649,675

(22) Filed: Oct. 11, 2012

(65) Prior Publication Data
US 2013/0231248 A1   Sep. 5, 2013

(30) Foreign Application Priority Data
Oct. 11, 2011   (KR) .................. 10-2011-0103791

(51) Int. Cl.
| G01R 33/38 | (2006.01) |
| H01F 6/04 | (2006.01) |
| G01R 33/3815 | (2006.01) |
| F16L 59/00 | (2006.01) |

(52) U.S. Cl.
CPC . H01F 6/04 (2013.01); F16L 59/00 (2013.01); G01R 33/3815 (2013.01); G01R 33/3804 (2013.01)

(58) Field of Classification Search
CPC .......... G01R 33/0358; G01R 33/0352; H01L 39/225
See application file for complete search history.

(56) References Cited

U.S. PATENT DOCUMENTS

| 2004/0145366 A1 | 7/2004 | Baudenbacher et al. |
| 2011/0031253 A1 | 2/2011 | Nowak et al. |

FOREIGN PATENT DOCUMENTS

| JP | 548156 A | 2/1993 |
| JP | 2000133514 A | 5/2000 |
| JP | 2003178914 A | 6/2003 |
| JP | 2004127964 A | 4/2004 |

OTHER PUBLICATIONS

Machine translation of JP 2003-178914, Jun. 27, 2003.*
International Search Report, dated Mar. 14, 2013, issued by the International Patent Office in counterpart International Application No. PCT/KR2012/008258.

* cited by examiner

*Primary Examiner* — Colleen Dunn
(74) *Attorney, Agent, or Firm* — Sughrue Mion, PLLC

(57) ABSTRACT

Provided is a superconductive electromagnet apparatus including a thermal anchor, a plurality of wires and a cryogenic cooling device which cools the thermal anchor. The thermal anchor includes a body part, at least one connecting part disposed on a surface of the body part and made up of a conductive material. The plurality of wires is connected to the connecting part.

15 Claims, 5 Drawing Sheets

SUPERCONDUCTIVE ELECTROMAGNET APPARATUS

CROSS-REFERENCE TO RELATED APPLICATION

This application claims priority from Korean Patent Application No. 2011-0103791, filed on Oct. 11, 2011 in the Korean Intellectual Property Office, the disclosure of which is incorporated herein by reference in its entirety.

BACKGROUND

1. Field

Apparatuses and methods consistent with exemplary embodiments relate to a superconductive electromagnet apparatus configured to operate as a superconductive electromagnet at a cryogenic state.

2. Description of the Related Art

In the related art, a superconductive electromagnet apparatus is configured to be applied with a current and generate a strong magnetic force while operating as a superconductive electromagnet at a cryogenic state.

The superconductive electromagnet apparatus as such includes a coil assembly having a coil which generates a magnetic field by being applied with a current, a helium container in which the coil assembly and a liquefied helium are accommodated, a cryogenic cooling device which cools the helium such that the helium disposed inside the helium container may maintain the cryogenic state, and a current supplying apparatus which supplies a current to the coil assembly and the cryogenic cooling apparatus, and a current is supplied to the coil of the coil assembly by having a wire which extends from the current supplying apparatus connects to the coil.

A magnetic resonance imaging apparatus uses the superconductive electromagnet apparatus to obtain a cross-sectional image of a body by using a nuclear magnetic resonance phenomenon that is generated by a strong magnetic force generated from the superconductive electromagnet apparatus, and is referred to as a Magnetic Resonance Imaging (MRI).

SUMMARY

One or more exemplary embodiments provide a superconductive electromagnet apparatus which prevents an outside heat from being delivered to a coil through a wire.

In accordance with an aspect of an exemplary embodiment, there is provided a superconductive electromagnet apparatus including a thermal anchor, a plurality of wires and a cryogenic cooling device. The cryogenic cooling device may cool the thermal anchor. The thermal anchor may include a body part and at least one connecting part disposed on a surface of the body part while including conductive material. The plurality of wires is connected to the connecting part.

The at least one connecting part may include a plurality of connecting parts disposed on the body part and spaced apart from each other.

The body part may have a cylindrical shape, and the plurality of connecting parts are disposed on an outer circumferential surface of the body part and spaced apart from each other in a circumferential direction of the body part.

The thermal anchor may include an insulation layer that is provided on an outer surface of the body part and insulates the body part from the connecting part.

The insulation layer may include an alumina layer.

The insulation layer may be disposed the body part through a plasma spray process.

The thermal anchor may further include an affixation panel affixes the connecting part to the insulation layer.

The thermal anchor may include a fixation part which engages with the cryogenic cooling device, and the superconductive electromagnet apparatus may further include a fixation member which engages with the fixation part such that the cryogenic cooling device is disposed in between the fixation part and the fixation member.

Each of the fixation part and the fixation member has an arc shape.

The superconductive electromagnet apparatus may further include a coil and a power supplying apparatus. The coil may be supplied with a current and generate a magnetic field by being supplied with a current. The power supplying apparatus may supply the current to the coil, where the plurality of wires may include a first wire which extends from the coil and a second wire which extends from the current supplying apparatus.

A magnetic resonance imaging apparatus which obtains a cross-section image of a living body may include the superconductive electromagnet apparatus of the current exemplary embodiment.

In accordance with another aspect of the exemplary embodiment, there is provided a superconductive electromagnet apparatus including a coil, a power supplying apparatus, a cryogenic cooling device and a thermal anchor. The power supplying apparatus may supply a current. The coil may receive the current and generate a magnetic field. The cryogenic cooling device may cool the coil and the thermal anchor to maintain the coil at a cryogenic state. A first wire extending from the coil and a second wire extending from the power supplying apparatus connected thereto and may be configured to prevent heat from being delivered to the coil through the wires, where the thermal anchor may include a body part and at least one connecting part including a conductive material disposed on a surface of the body part, and to which the first and second wire are connected, the connecting part comprising a conductive material.

In accordance with yet another aspect of the exemplary embodiment, there is provided a thermal anchor for preventing delivery of heat from an external source to a coil system of a superconductive electromagnet apparatus, the thermal anchor including a body part having a cylindrical shape, at least one affixation panel that is disposed on an outer circumferential surface of the body part, at least one connecting part that is disposed on the affixation panel, a fixation part that is disposed on a first end of the body part and extends from the body part in a radial direction; a first wire which is connected to the connecting part and the external source; and a second wire which is connected to the connecting part and the coil.

The at least one affixation panel includes a plurality of affixation panels disposed on the outer circumferential surface of the body part, and the at least one connecting part comprises a plurality of connecting parts disposed on the affixation panels and spaced apart from each other in a circumferential direction of the body part.

The thermal anchor may also include an insulation layer disposed on the outer circumferential surface of the body part and insulating the body part from the connecting part.

The thermal anchor may also include a fixation member. The fixation part and the fixation member together engage with a cooling device which cools the thermal anchor.

As described above, the superconductive electromagnet apparatus in accordance with an aspect of an exemplary embodiment, may prevent the heat from being delivered to the coil through the wire, even in a case when a heat from an outside is delivered through a wire, since the heat is absorbed to the cryogenic cooling apparatus through the thermal anchor, and accordingly, the superconductive electromagnet apparatus may further operate in a stable manner.

BRIEF DESCRIPTION OF THE DRAWINGS

The above and/or other aspects of the disclosure will become apparent and more readily appreciated from the following description of exemplary embodiments, taken in conjunction with the accompanying drawings of which.

DETAILED DESCRIPTION

Figure 1:
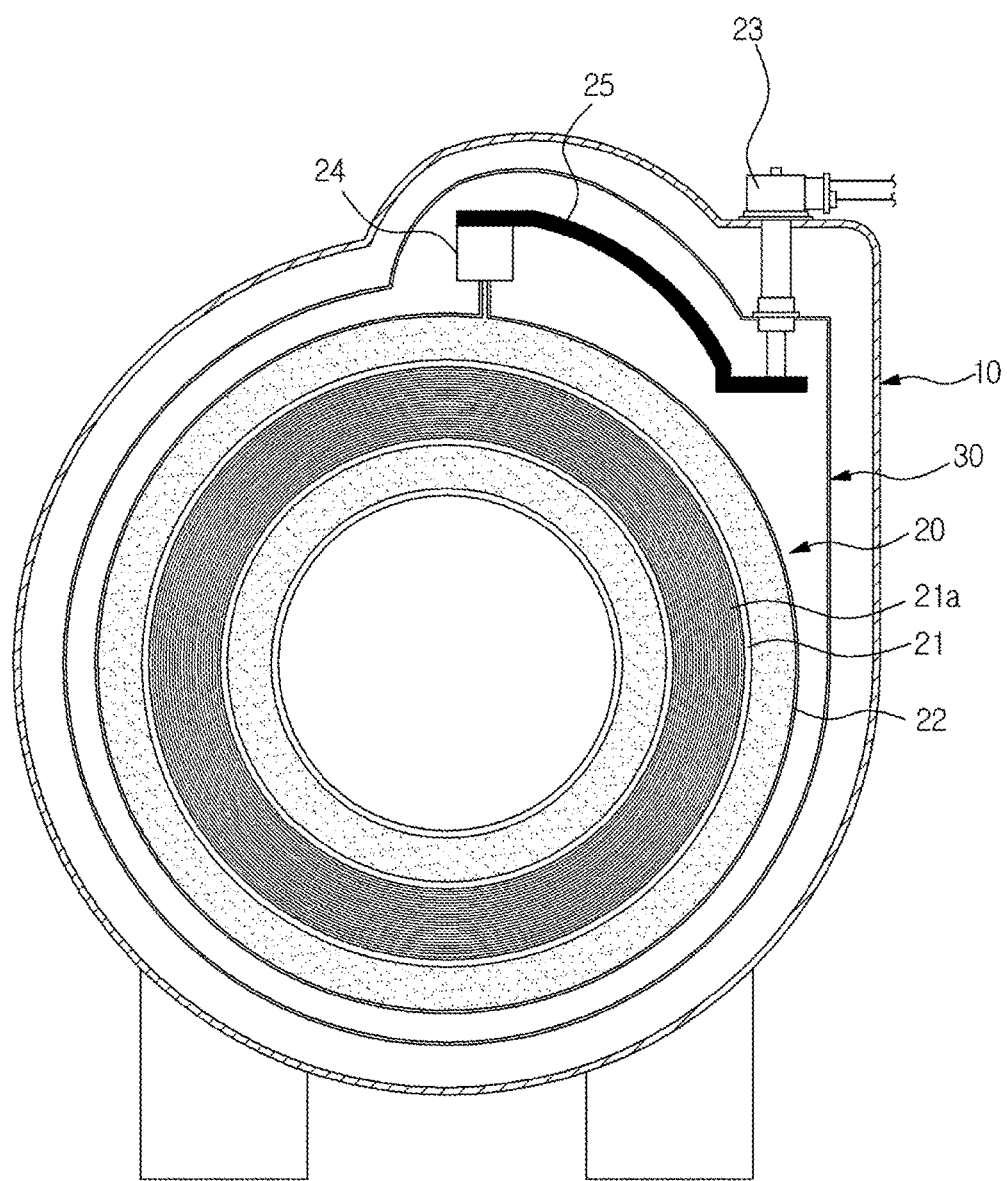
FIG. 1 is a schematic drawing illustrating a magnetic resonance imaging apparatus employed with a superconductive electromagnet apparatus according to an exemplary embodiment.

Reference will now be made in detail to the exemplary embodiments, examples of which are illustrated in the accompanying drawings, wherein like reference numerals refer to like elements throughout.

As illustrated on FIG. 1, a magnetic resonance imaging apparatus using a superconductive electromagnet apparatus according to an exemplary embodiment includes a housing 10 forming an exterior thereof, and a superconductive electromagnet apparatus 20 installed in the housing.

The housing 10 has a ring shape such that a patient may enter an interior of the superconductive electromagnet apparatus 20, and an inner surface of the housing 10 is provided with a plurality of insulation layers disposed therein for insulation.

The superconductive electromagnet apparatus 20 includes a coil assembly 21 having a coil 21a configured to operate as a superconductive electromagnet by being supplied with a current from a power supplying apparatus 40, a helium container 22 has a ring shape, is filled with liquefied helium and accommodates the coil assembly 21 therein, and a cryogenic cooling device 23 which cools the helium to maintain the liquefied state. The superconductive electromagnet apparatus 20 includes a current supplying apparatus 40 which connects to an external power source and supplies a current while being connected to the coil 21a and the cryogenic cooling apparatus 23 through a wire W.

In addition, the superconductive electromagnet apparatus 20 includes a condensing chamber 24 which is provided at an upper side of the helium container 22 and to which the helium in a vaporized state is introduced, and a heat delivering member 25 having one end thereof disposed at an upper surface of the condensing chamber 24 and another end thereof connected to the cryogenic cooling apparatus 23. A vacuum container 30 is disposed in between the housing 10 and the helium container 22, and the vacuum container 30 is provided with the helium container 22 accommodated therein while having an inside thereof maintained in a vacuum state for insulation purpose.

When a heat is generated at the coil assembly 21, the heat is absorbed by the liquefied helium at an inside the helium container 22 and the heat evaporates a portion of the liquefied helium. This heat transfer enables the coil assembly 21 to maintain the cryogenic state.

The helium in a vaporized state that is evaporated by the heat generated by the coil assembly 21 is moved to an upper side of the coil assembly 21 due to the difference in density between the helium in a vaporized state and the helium in a liquefied state, and is introduced to the condensing chamber 24. The helium in a vaporized state that is introduced to the condensing chamber 24 contacts one end of the heat delivering member 25 disposed at an upper surface of the condensing chamber 24 and changes into a liquefied state, and the liquefied helium is introduced into the inside the helium container 22 again after freefalling by gravity.

In addition, the superconductive electromagnet apparatus 20 is provided with wires W connected thereto for delivering the current from the power supplying apparatus 40 to the coil 21a disposed inside the coil assembly 21.

The wires W are formed with metals having high electrical conductivity and high heat conductivity such as copper or aluminum. Thus, the wires W deliver not only the current but also the heat from an outside to the coil 21a, and when the temperature of the coil 21a is increased as the heat is delivered to the coil 21a, the operation of the superconductive electromagnet apparatus 20 may become unstable as the superconductive electromagnet apparatus 20 operates only in the cryogenic state while operating in a superconductive state.

Figure 2:
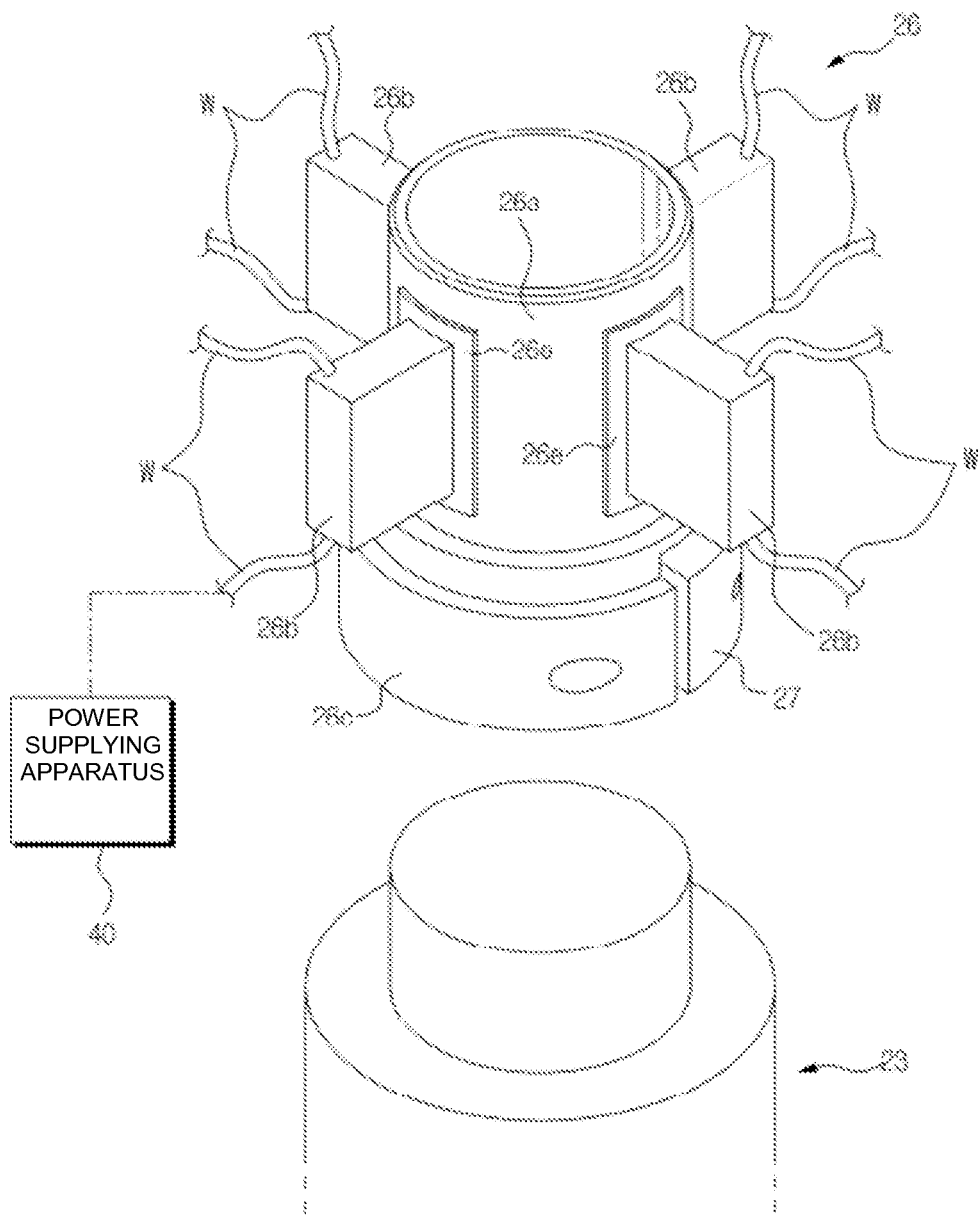
FIG. 2 is a perspective view illustrating a thermal anchor of the superconductive electromagnet apparatus according to the exemplary embodiment.
Figure 3:
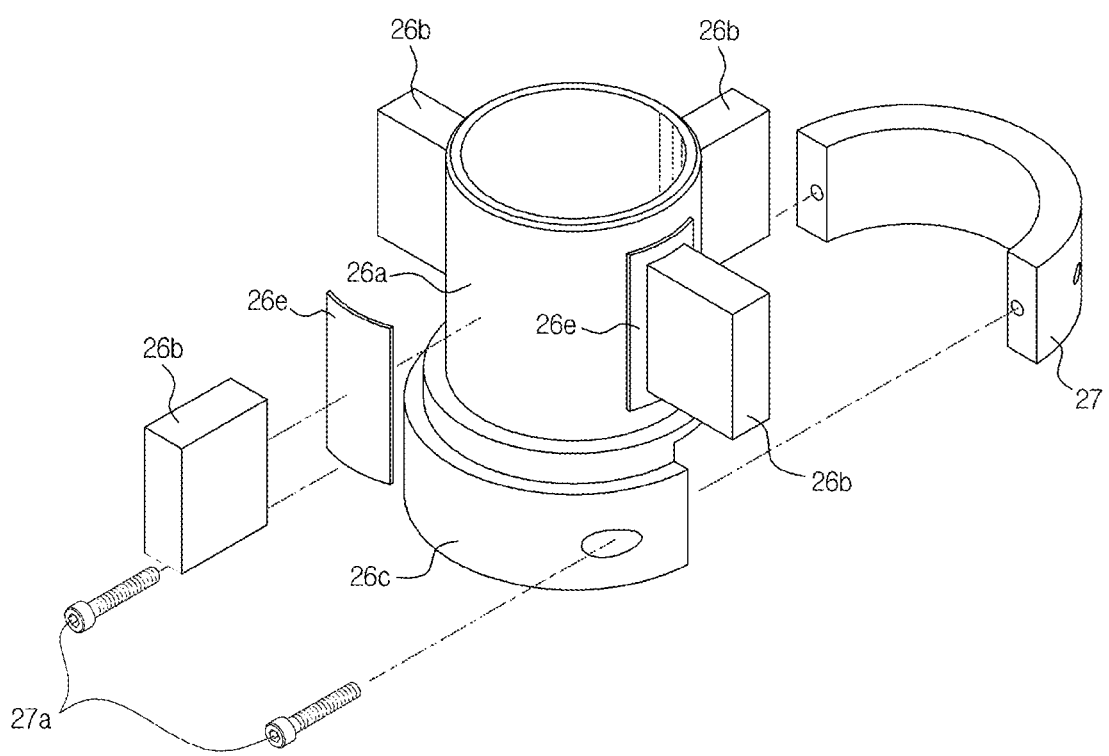
FIG. 3 is a partially exploded perspective view illustrating a thermal anchor of the superconductive electromagnet apparatus according to the exemplary embodiment.

Thus, as illustrated on FIGS. 2 to 3, the superconductive electromagnet apparatus 20 according to the exemplary embodiment includes a thermal anchor 26 configured to prevent the heat, which is delivered from the power supplying apparatus 40 through the wires W, from being delivered to the coil assembly 21.

The thermal anchor 26 is installed at a head part of the cryogenic cooling device 23 to be cooled by the cryogenic cooling device 23. The thermal anchor 26 includes a body part 26a, at least one connecting part 26b disposed on a surface of the body part 26a and provided with the plurality of wires W connected thereto, and a fixation part 26c provided at one end of the body part 26a and configured so that the thermal anchor 26 may be fixedly installed at the head part of the cryogenic cooling device 23.

Figure 4:
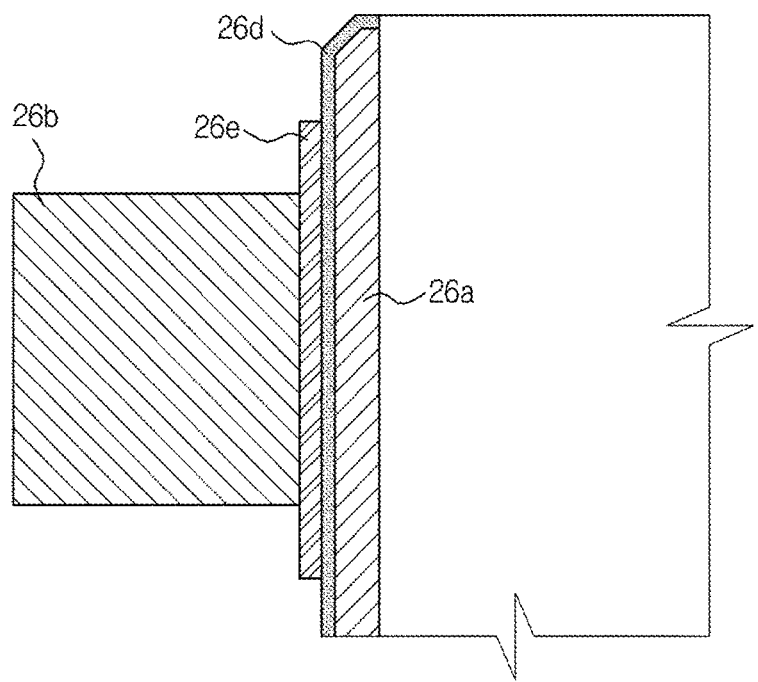
FIG. 4 is a partial, cross-sectional view illustrating a thermal anchor of the superconductive electromagnet apparatus according to the exemplary embodiment.

The body part 26a a cylindrical shape and is formed with metallic material having high heat conductivity for heat to be easily transferred, and as illustrated on FIG. 4, a surface of the body part 26a is provided with an insulation layer 26d formed thereon to insulate the body part 26a and the connecting part 26b from one another. The body part 26a of the exemplary embodiment is formed with a copper material, and the insulation layer 26d is formed with an alumina layer that is formed on an entire outer surface of the body part 26a through a plasma spray process.

Referring to FIG. 3, the connecting part 26b is formed with a conductive material such that the wires W which connect to the connecting part 26b may be connected to each other through the connecting part 26b. The wires, which are provided in a plurality of pairs, are disposed on an outer surface of the connecting part 26b while being spaced apart from each other such that the paired wires connect to each other. Since the body part 26a of the exemplary embodiment, as previously described, has a cylindrical shape, the plurality of connecting parts 26b are disposed on an outer circumferential surface of the body part 26a in a circumferential direction while being separated by a distance from each other.

In addition, at least one affixation panel 26e fixed to an outer surface of the body part 26a such that the connecting part 26b may be easily attached to the body part 26a through the affixation panel 26e, and the affixation panel 26e is configured so that the connecting part 26b may be fixed to the affixation panel 26e by welding or fusion welding. The affixation panel 26e may be formed with copper.

The fixation part 26c of the thermal anchor 26 is provided with a fixation member 27 installed thereto through one or more fastening members 27a such as a screw, and a head part of the cryogenic cooling device 23 fixedly installed in between the fixation part 26c and the fixation member 27. Each of the fixation part 26c and the fixation member 27 of the exemplary embodiment have a semicircular arc shape, and the head part of the cryogenic cooling device 23 which has a cylindrical shape may be fixed to each of the fixation part 26c and the fixation member 27.

Thus, after the thermal anchor 26 is installed at the head part of the cryogenic cooling device 23 through the fixation part 26c and the fixation member 27 and after a first wire W extended from the power supplying apparatus 40 and a second wire W extended from the coil 21a each is connected to the connecting part 26b, and if the thermal anchor 26 engages with the cryogenic cooling device 23, the heat from the outside, even in a case when the heat is delivered to the connecting part 26b of the thermal anchor 26 via the wire W connected to the power supplying apparatus 40, is absorbed by the cryogenic cooling device 23 through the connecting part 26b of the thermal anchor 26 and the body part 26a, thereby preventing the heat from being delivered to the coil 21a via the wire W.

Figure 5:
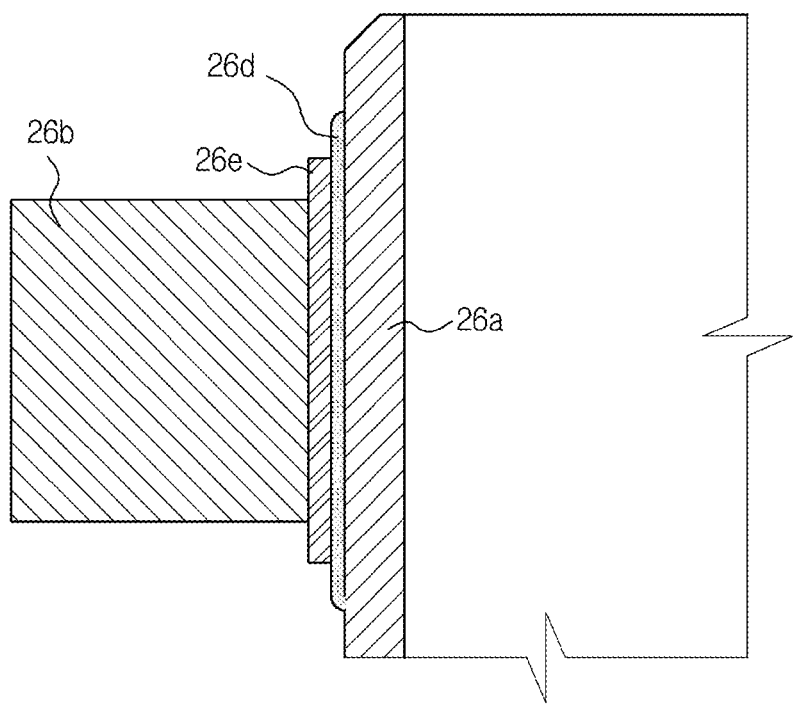
FIG. 5 is a partially exploded perspective view illustrating a thermal anchor of a superconductive electromagnet apparatus according to another exemplary embodiment.

The insulation layer 26d of the exemplary embodiment is formed on the entire surface of the body part 26a, but the exemplary embodiment is not limited hereto, and as illustrated on FIG. 5, an insulation layer 26d' may be formed on only a portion at which the connecting part 26b is disposed.

In addition, the body part 26a of the exemplary embodiment has a cylindrical shape, but the exemplary embodiment is not limited thereto, and the insulation part may have various shapes, for example, a polygonal shape.

In addition, the insulation layer 26d of the exemplary embodiment is formed with alumina, but the exemplary embodiment is not limited hereto, and the insulation layer 26d may be formed with various materials that may insulate a current while the transfer of a heat may be easily performed.

In addition, the body part 26a and the connecting part 26b of the thermal anchor 26 of the exemplary embodiment are formed with copper, but the exemplary embodiment is not limited hereto, and various materials having high conductivity such as copper, copper alloy, aluminum, and aluminum alloy may be selectively used.

While exemplary embodiments have been particularly shown and described above, it would be appreciated by those skilled in the art that various changes may be made therein without departing from the principles and spirit of the present inventive concept as defined by the following claims.

What is claimed is:

1. A superconductive electromagnet apparatus comprising:
a thermal anchor;
a plurality of wires; and
a cryogenic cooling device which cools the thermal anchor,
wherein the thermal anchor comprises a body part and at least one connecting part disposed on a surface of the body part and comprising a conductive material,
wherein the plurality of wires is connected to the connecting part, and
wherein the thermal anchor comprises a fixation part which engages with the cryogenic cooling device, and the superconductive electromagnet apparatus further comprises a fixation member which engages with the fixation part such that the cryogenic cooling device is installed in between the fixation part and the fixation member.

2. A superconductive electromagnet apparatus comprising:
a thermal anchor;
a plurality of wires; and
a cryogenic cooling device which cools the thermal anchor,
wherein the thermal anchor comprises a body part and at least one connecting part disposed on a surface of the body part and comprising a conductive material,
wherein the plurality of wires is connected to the connecting part, and
wherein the at least one connecting part comprises a plurality of connecting parts disposed on the body part and spaced apart from each other.

3. The superconductive electromagnet apparatus of claim 2, wherein the body part has a cylindrical shape, and the plurality of connecting parts are disposed on an outer circumferential surface of the body part and spaced apart from each other in a circumferential direction of the body part.

4. A superconductive electromagnet apparatus comprising:
a thermal anchor;
a plurality of wires; and
a cryogenic cooling device which cools the thermal anchor,
wherein the thermal anchor comprises a body part and at least one connecting part disposed on a surface of the body part and comprising a conductive material,
wherein the plurality of wires is connected to the connecting part, and
wherein the thermal anchor comprises an insulation layer that is provided on an outer surface of the body part and insulates the body part from the connecting part.

5. The superconductive electromagnet apparatus of claim 4, wherein the insulation layer comprises an alumina layer.

6. The superconductive electromagnet apparatus of claim 4, wherein the insulation layer is disposed on the body part through a plasma spray process.

7. The superconductive electromagnet apparatus of claim 4, wherein the thermal anchor further comprises an affixation panel which affixes the connecting part to the insulation layer.

8. The superconductive electromagnet apparatus of claim 1, wherein each of the fixation part and the fixation member has an arc shape.

9. The superconductive electromagnet apparatus of claim 1, further comprising:
a coil which is supplied with a current and generates a magnetic field, and
a power supplying apparatus which supplies the current to the coil,
wherein the plurality of wires comprise a first wire which extends from the coil and a second wire which extends from the current supplying apparatus.

10. A magnetic resonance imaging apparatus which obtains a cross-section image of a living body, the magnetic resonance imaging apparatus comprising the superconductive electromagnet apparatus of claim 1.

11. A superconductive electromagnet apparatus comprising:
a power supplying apparatus which supplies a current;
a coil which receives the current and generates a magnetic field;

a thermal anchor to which a first wire extending from the coil and a second wire extending from the power supplying apparatus are connected, and which is configured to prevent heat from being delivered to the coil through the first and second wires; and a cryogenic cooling device which cools the coil and the thermal anchor to maintain the coil at a cryogenic state; and wherein the thermal anchor comprises:

a body part; and at least one connecting part disposed on a surface of the body part, and to which the first and second wires are connected, the connecting part comprising a conductive material.

12. The superconductive electromagnet apparatus of claim 11, wherein the body part has a cylindrical shape, and
the at least one connecting part comprises a plurality of connecting parts disposed on the body part and spaced apart from each other in a circumferential direction of the body part.

13. The superconductive electromagnet apparatus of claim 11, wherein the thermal anchor comprises an insulation layer that is provided on the surface of the body part and insulates the body part from the connecting part.

14. The superconductive electromagnet apparatus of claim 13, wherein the thermal anchor further comprises an affixation panel which affixes the connecting part on the insulation layer.

15. A magnetic resonance imaging apparatus which obtains a cross-sectional image of a living body, the magnetic resonance imaging apparatus comprising the superconductive electromagnet apparatus of claim 11.

* * * * *